(12) United States Patent
Maylin et al.

(10) Patent No.: US 6,747,449 B1
(45) Date of Patent: Jun. 8, 2004

(54) ELONGATE GMI INTEGRATING MAGNETIC SENSOR

(75) Inventors: Mark G Maylin, Farnborough (GB); Jonathan G Gore, Farnborough (GB); Patrick T Squire, Bath (GB); Derek Atkinson, Bath (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/743,315

(22) PCT Filed: Jun. 22, 1999

(86) PCT No.: PCT/GB99/01967

§ 371 (c)(1),
(2), (4) Date: Jan. 9, 2001

(87) PCT Pub. No.: WO00/03260

PCT Pub. Date: Jan. 20, 2000

(30) Foreign Application Priority Data

Jul. 9, 1998 (GB) .............................................. 9814848

(51) Int. Cl.[7] .............................................. G01R 33/09

(52) U.S. Cl. ........................................ 324/247; 324/260
(58) Field of Search ................................. 324/249, 253, 324/244, 260, 225

(56) References Cited

FOREIGN PATENT DOCUMENTS

| EP | 0 798 751 | 10/1997 |
|---|---|---|
| EP | 0 892 276 | 1/1999 |
| GB | 2 313 918 | 12/1997 |

OTHER PUBLICATIONS

Mohri K et al.: "Magneto–impedance element" IEEE Transactions on Magnetics, (Jul. 1995) USA vol. 31, No. 4, pp. 2455–2460.

*Primary Examiner*—Walter E. Snow
(74) *Attorney, Agent, or Firm*—Nixon & Vanderhye P.C.

(57) ABSTRACT

An integrating magnetic sensor is described which comprises a sensor element made from a filament of substantially amorphous material which exhibits giant magneto-impedance and means for applying a bias field to the said sensor element so that it operates in the high field section of the giant magneto-impedance response.

10 Claims, 4 Drawing Sheets

ELONGATE GMI INTEGRATING MAGNETIC SENSOR

This application is the U.S. national phase of International Application No. PCT/GB99/01967, filed 22 Jun. 1999, which designated the U.S., the entire content of which is hereby incorporated by reference.

BACKGROUND OF THE INVENTION

1. Field of the Invention

This invention relates to sensors and in particular provides an integrating magnetic sensor for measuring magnetic fields over appreciable distances.

2. Discussion of Prior Art

There are a number of different materials and techniques that can be used to measure magnetic fields. The common factor is that the sensors are in point form i.e. they can only measure the strength of the external magnetic field at the point in the field where they are positioned. Typical examples include magneto-resistant materials, Hall probes and flux gates. Another method for measuring a magnetic field is to use giant magneto impedance. Giant magneto impedance (GMI) is a known property of certain materials and is characterised in that a change in the complex impedance of the sensor occurs at high frequencies of alternating current when it is subject to an applied magnetic field.

If conventional magnetic sensors are used measure a magnetic field over a large area, there are currently two options. Either the whole area to be assessed has to be covered in sensors or a plurality of sensors placed at intervals in the region to be assessed coupled with mathematical interpolation is required. The first of these options allows the whole magnetic field to be accurately measured but is impractical as a large number of sensors would be required. The second option is the one usually employed. However, this is error prone as only the discrete sections of the field covered by the sensors can be accurately measured. Mathematical interpolation is used in conjunction with the results from the sensors to give an integrated field measurement. Magnetic fields fluctuate so the accuracy of this integrated field measurement depends on where the sensors have been positioned within the field.

Materials which exhibit giant magneto impedance (GMI) exhibit a large sensitivity in impedance to changes in magnetic field strength when subject to high frequencies of alternating current. The relationship between the impedance of the material and an external magnetic field is complicated. There are two distinct sections to the GMI response low-field and high field.

If a material exhibiting GMI is produced as an amorphous elongate, the relationship between its impedance and an applied external magnetic field can be exploited. An elongate is hereinafter described as meaning a filament, wire or other object where one dimension of the object is of significantly higher magnitude than the other two which are substantially similar. The magnetic field resultant within the elongate material is characterised in that there are two competing magnetisation directions within the elongate. The magnetic structure of such an amorphous elongate is characterised in that if a cross section is taken through the elongate, the outer part is aligned circumferentially and the central part of the elongate is aligned along the length of the elongate. The proportion of the cross sectional area aligned in each direction depends on the strength of the magnetic field that the elongate is in. As the applied magnetic field is increased, the axial domain grows and this feature results in a change in the inductance of the material. The inductance of a material is related to the magnitude of its impedance, as shown below:

$$Z = \sqrt{R^2 + \omega^2 L^2}$$

Where Z is the impedance of the elongate, R the resistance of the elongate, ω the angular frequency of the applied alternating current and L the inductance of the elongate. When these materials are subject to an alternating power supply, a phase difference results between the measured voltage and current. The complex impedance of a material is the complex ratio of sinusoidal voltage to current, as shown below:

$$Z = \frac{V}{I} + jX$$

Where Z is the impedance of the elongate, V the voltage across the elongate, I is the current in the circuit containing the elongate, X the reactance of the elongate and $j=\sqrt{-1}$ Thus, a change in the average value of an applied external magnetic field will result in a change in the resistance and reactance of the material, which consequently affects the impedance. By measuring the voltage and current in a circuit which contains a material which exhibits GMI, the impedance can be calculated and this is related to the average external magnetic field.

The impedance of a material exhibiting GMI has a characteristic shape illustrated in FIG. 1. When the applied magnetic field is increased from zero, the impedance of the sensor increases rapidly to a maximum value (S) and as the field strength is further increased, the impedance of the sensor decreases monotonically. The GMI response can be measured in either of these two sections and the one chosen will depend on the application the sensor is to be used for. In section A of FIG. 1, where the impedance of the material increases as the external magnetic field strength is increased, the material is sensitive to changes in the external magnetic field strength. The magnetic permeability of the material changes as the field is increased to the saturation point (S). This is the low-field section of the GMI response. Sensors utilising this section commonly operate in closed-loop mode whereby a magnetic field is generated to compensate the ambient magnetic field. In section B, where the impedance decreases from the saturation point (S) as the external magnetic field strength is increased, the wire is magnetically saturated. The magnetic permeability of the material is not sensitive to field changes in this section (B). This is high-field section of GMI. The sensor described herein utilises this section and operates in open-loop mode whereby the bias magnetic field is of a fixed value.

When a sensor is subject to external magnetic fields below its magnetic saturation point (S) the material is not magnetically saturated and so, the magnetic permeability of the material will change as the external magnetic field changes. The result of this is that sensors operating in section A can get distorted results. The reason for this is explained as follows. If the sensor is considered as a line of small, discrete sections each measuring a local part of the external magnetic field, some of these discrete sections will register a different magnetic field strength than the external magnetic field strength. As the sensor is not magnetically saturated the magnetisation of discrete sections of the elongate will be affected by adjacent sections of the elongate. This results in a distortion in the measured external magnetic field strength. The inaccuracies in measured external magnetic field strength resulting from the change in magnetisation of the sensor along its length are dependant on the magnetic field the sensor is measuring. If a GMI sensor is operated in a low field section (section A), an accurate measurement of a magnetic field is not possible if the sensor is longer than a certain length. The maximum length being determined from the sensitivity of the magnetic permeability of the material being used. Point sensors manufactured out of materials exhibiting GMI in closed loop configuration, operating in section A i.e. below the magnetic saturation point of the material, have been produced using amorphous wires 1 mm long and 50 µm in diameter. GB,A, 2 313 918 discloses such a sensor.

If a GMI sensor is operated in the high-field section (section B), the material is magnetically saturated, so the permeability of the material is not affected by changes in external magnetic field strength. This means that the limitations on the length of the sensor that can be used in the closed loop configuration, low field section, do not apply. The discrete sections of the sensor do not cause local distortions in the magnetic field of the sensor as the magnetic permeability of the sensor is not affected by the magnitude of the external magnetic field. Therefore accurate readings for the external magnetic field strength can be determined.

An important aspect of elongate GMI magnetic sensors operated in the high field section of the GMI response section is that they integrate the magnetic field response. If the sensor is considered as a line of small, discrete sections each measuring the magnetic field local to it, the impedance response of the whole sensor is the sum of all the discrete section impedances. This gives an average magnetic field strength for the externally applied magnetic field. As the discrete sensors operated in the high field section do not experience a change in magnetic permeability as the external applied magnetic field strength changes, every maximum and minimum in the external applied magnetic field is measured along the length of the elongate. The total impedance response is the sum of these elemental impedances, giving a representative average value of the applied magnetic field.

In order to produce a GMI sensor operating in an open loop configuration, a fixed bias field is produced around the elongate. The magnitude of the required bias field is determined from the impedance characteristics of the elongate when related to external magnetic field (FIG. 1). The bias field strength is chosen as a value above (S), the magnetic saturation point. To ensure that the sensor can operate in negative external magnetic fields as well as positive external magnetic fields, the bias field is conveniently chosen as a value near the mid point of the high field section of the GMI response section (B) because, as a person skilled in the art will realise that this will reduce the chance of the GMI sensitive material experiencing an inverse in its GMI response and thus function in the low-field section of the GMI response.

There are a number of ways to produce the bias field. A solenoid winding placed around the elongate may be used, but sensor performance can be affected. If a solenoid driven by a power supply is used, noise from the power source can affect the results obtained. If the solenoid is driven by a battery source drifting of the reading can occur when the battery power becomes low.

A more effective solution is to incorporate a permanent magnetic sheath around the elongate. This may be done by incorporating a suitable magnetic material into a polymer sheath and covering the amorphous elongate with said sheath. The amount of magnetic material required depends on the strength of the desired bias field. One such material is $Nd_2Fe_{14}B$, although other examples will be obvious to those skilled in the field.

The present invention is directed towards the provision of an magnetic sensor element characterised in that the sensor is elongate, operates under a bias field and utilises the high field section of the GMI response, thus eliminating the need for a multitude of elemental sensors and the need for mathematical interpolation of an external magnetic field between sensors which can introduce errors in the results obtained.

This invention consists of a magnetic sensor for measuring a magnetic field characterised by an elongate element comprising a substantially amorphous material which exhibits giant magneto-impedance response and bias means to bias the field applied to said element so that it operates in the high field section.

A bias field can be produced in a number of ways. A preferable method is to place a solenoid winding around the elongate magnetic material. A more preferred method is to incorporate a permanent magnetic sheath around the elongate magnetic material.

The material used for the sensor is preferably an alloy capable of being formed into of an amorphous elongate by a suitable process, for example melt-spinning.

The material used for the sensor is preferably an alloy with a sensitive magneto-impedance response over the range required for the particular application. Examples of materials suitable for use in an elongate magnetic sensor are $Co_{72.5}Si_{12.5}B_{15}$, and $(Co_{0.94}Fe_{0.06})_{72.5}Si_{12.5}B_{15}$. A small addition of iron to the alloy reduces the magnetostriction of the material so, on the application of a magnetising force, the GMI response of the material is less susceptible to elastic deformation. A particularly preferred alloy has the composition $(Co_{0.94}Fe_{0.06})_{72.5}Si_{12.5}B_{15}$, as this can be produced as an elongate, a large magneto-impedance so is very sensitive to changes in magnetic field strength.

A more efficient magnetic sensor can be produced by post-production conditioning such as annealing. This improves the metallurgical properties of said elongate by removing residual stresses in the elongate and aligning the magnetic domains in the desired direction thus giving greater magnetisation in that direction and hence a more sensitive sensor.

The impedance of the elongate can be monitored by the use of a bridge circuit, in which the resistive and inductive components of the elongate material are balanced. The real and imaginary output of the bridge circuit can be measured by a lock-in amplifier. A more accurate measurement of the impedance of the elongate can be made by combining the real or in-phase and imaginary or quadrature components of the bridge output which improves the stability and linearity of the sensor response as a function of applied magnetic field. Thus, in a further embodiment of the invention a bridge circuit is used with the elongate. A more accurate sensor can be produced if the real and imaginary components of said bridge circuit are combined.

The invention is particularly applicable to accurately measuring magnetic fields. Thus, a particular embodiment of the invention comprises a sensor incorporating the elongate element hereinbefore described. The invention may be used in magnetic surveying equipment, magnetic signature control equipment, geomagnetic measuring equipment, security tagging control such as for clothing in shops and perimeter fencing.

A plurality of sensors can be used to produce a non-integrating sensor. If elongates according to the invention of different length are incorporated together and the measured fields compared, then the investigation of the change in magnetic field strength over the area can be conducted differently. A number of average external magnetic field strengths each covering the portions of the field analysed by different elongates will be produced. These average magnetic field strengths can be compared to give a non-integrated result. Thus, instead of an average magnetic field strength over the whole area investigated, a series of absolute values for the magnetic field strength can be obtained. The positions of these absolute values in relation to the sensors can be determined and related back to the area investigated.

BRIEF DESCRIPTION OF THE DRAWINGS

By way of example only, a number of embodiments of the invention will now be described with reference to the accompanying drawings, of which.

DETAILED DISCUSSION OF EMBODIMENTS

Figure 1:
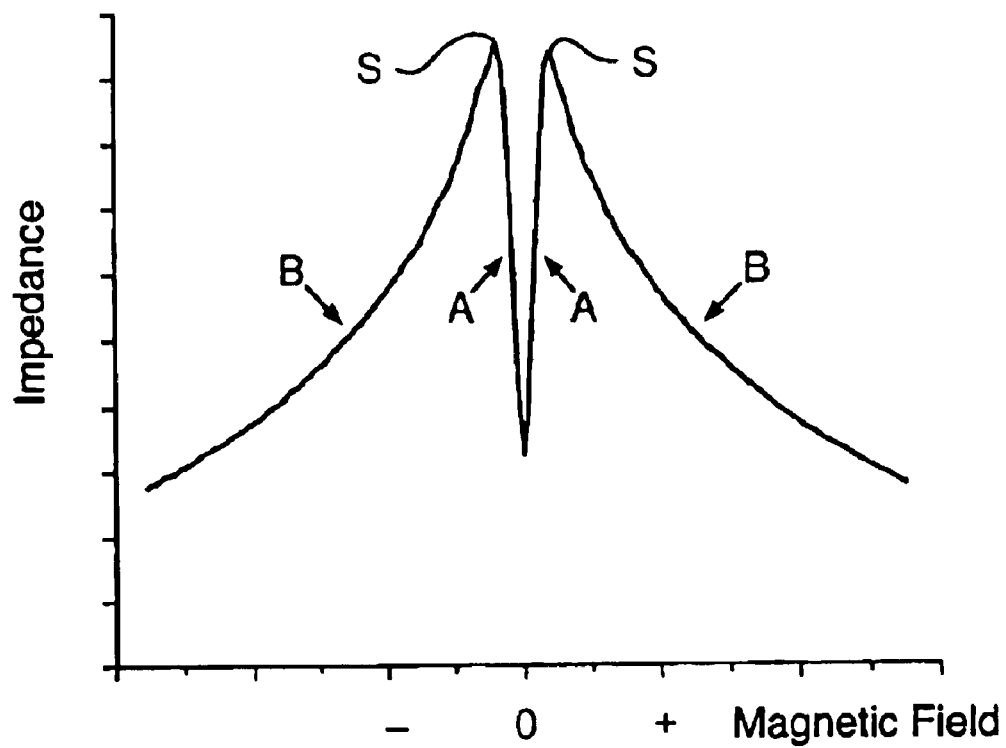
FIG. 1 is a plot of impedance, reactance and resistance verses magnetic field for a material exhibiting a GMI response

FIG. 1 shows the relationship of the impedance of an elongate to the external applied magnetic field strength. The GMI response changes when the technical saturation point (S) is reached. As the field is increased beyond this saturation point, there is an inversion in the GMI characteristic. At external applied magnetic fields below the technical saturation point (S), the impedance of the material increases as the external magnetic field increases (A). As the externally applied magnetic field strength increases above the technical saturation point (S), the impedance of the material decreases as the external magnetic field strength increases (B). The GMI response is therefore preferably measured in either at external magnetic field strengths below or above the technical saturation point. Section A, the low-field section, is more suitable for operation where small ranges of magnetic field are encountered and high sensitivity is required. Whereas section B, the high-field section, is more suitable for operation where larger ranges of magnetic field need to be measured with less sensitivity.

Figure 2:
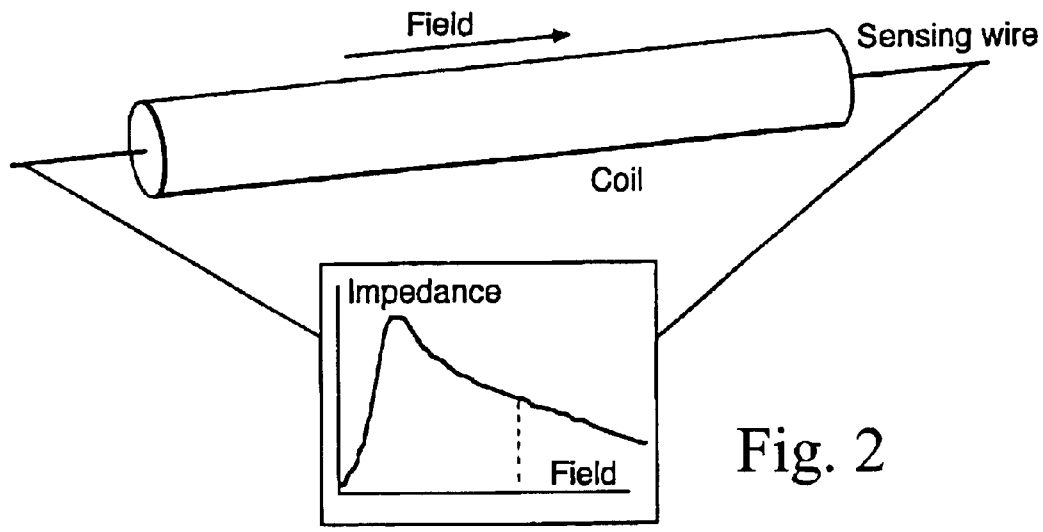
FIG. 2 shows a schematic of the GMI sensor configuration

FIG. 2 shows a schematic of the GMI sensor configuration. A sensing elongate material (1) is encased in a coil or sheath (2) which produces a bias field around the elongate.

Figure 3:
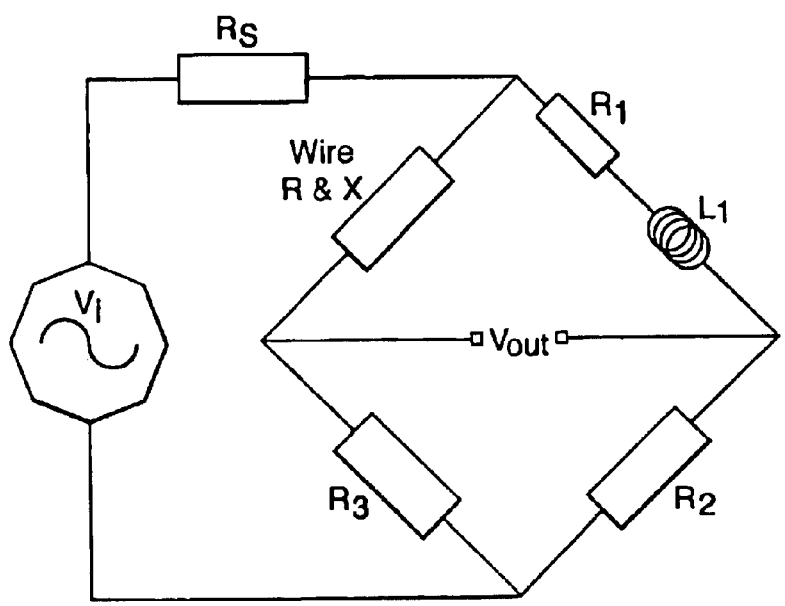
FIG. 3 is an illustration of a bridge circuit suitable for balancing the resistance and reactance of the elongate sensor

FIG. 3 shows an example of a suitable bridge circuit, where the resistance (R) and reactance (X) of the sensor (1) are balanced by $R_1$ and $L_1$. The resistance and reactance of the elongate are measured before the bridge circuit is set up to give values for $R_1$ and $L_1$. $R_2$ and $R_3$ which comprise the other two arms of the bridge circuit are of equal value. $R_s$ is the source resistance from the function generator. For the purposes of this study $R_2$ and $R_3$ were given values equal to the sum of R and $R_s$.

EXAMPLE 1

Figure 4:
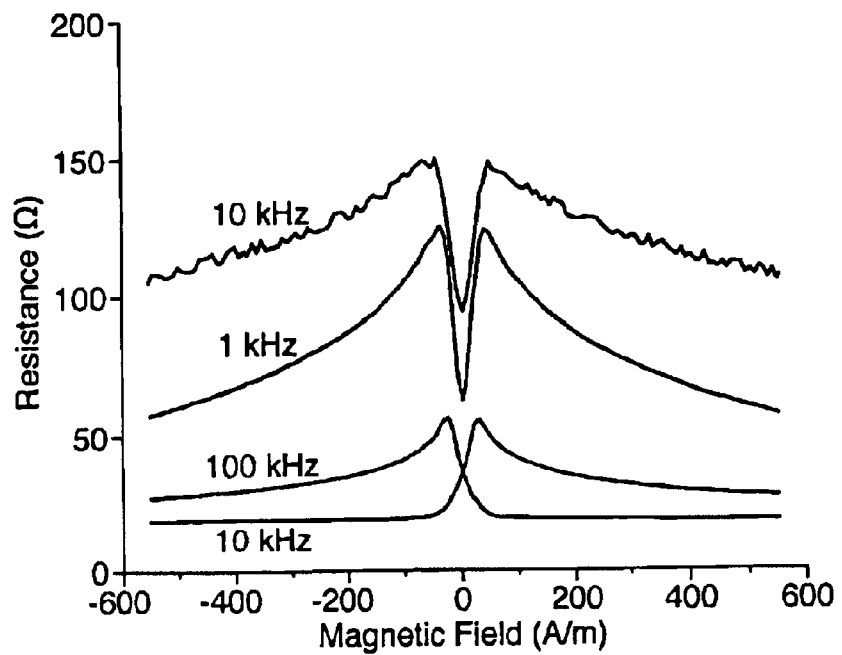
FIG. 4 is a graph showing the effect of four different voltage frequencies on the elongate impedance of one embodiment of the present invention.

A 20 cm length of amorphous elongate was used $((Co_{0.94}Fe_{0.06})_{72.5}Si_{12.5}B_{15})$. The elongate GMI response was determined at various excitation voltage frequencies to find the frequency at which maximum impedance sensitivity occurred. The results are shown in FIG. 4. The figure shows the effect of 4 different voltage frequencies on the elongate impedance. The voltage was kept at 0.4V for all the frequencies. At low voltage frequencies (100 KHz and below), the GMI response is low and the sensitivity of impedance to magnetic field strength is also low. At voltage frequencies of 1 MHz, the sensitivity of the impedance of the elongate to magnetic field strength is at a maximum. At voltage frequencies above 1 MHz, the sensitivity of the elongate impedance begins to reduce and there is more noise in the curve. This noise makes it harder to characterise the impedance-magnetic field strength relationship. A voltage excitation frequency of 1 MHz was found to be optimum. There is little noise in the curve and the change in impedance as the external magnetic field strength is changed is at a maximum.

EXAMPLE 2

Figure 5:
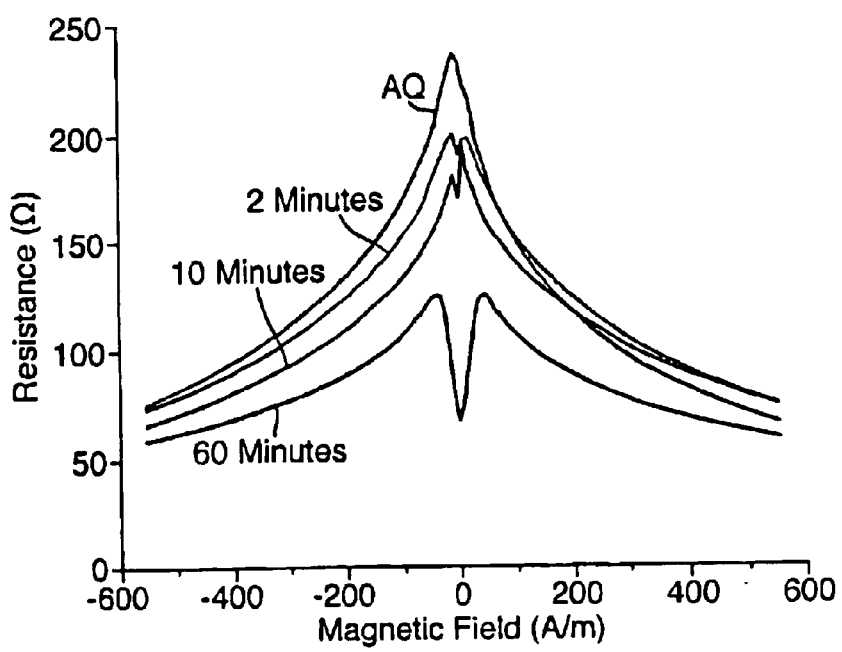
FIG. 5 shows the effect of annealing on the impedance response to external magnetic fields of various embodiments of the present invention as compared to non-annealed embodiments.

The effect of annealing the amorphous elongate was investigated. FIG. 5 shows the affect of annealing on $(Co_{0.94}Fe_{0.06})_{72.5}Si_{12.5}B_{15}$. The graph shows the effect of annealing from no annealing (the as quenched state) to 60 minutes at 472° C., on the impedance response to external magnetic filed strengths. By annealing the elongate material, the impedance-magnetic field strength curve is altered to a more uniform and so more easily characterised response. Annealing can improve the sensitivity of the elongate materials response to external magnetic field strength.

EXAMPLE 3

In order to produce a bias field along the length of the elongate, a solenoid was produced that encompassed the amorphous elongate. The solenoid was made significantly longer than the elongate such that a constant bias field along the elongate was achieved.

EXAMPLE 4

Figure 6A:
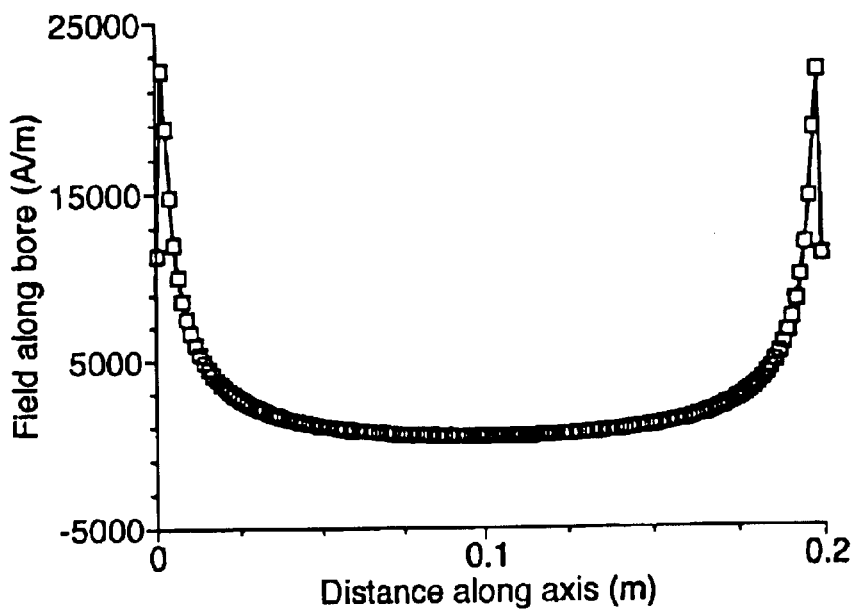
FIG. 6a shows the calculated variation in bias field strength along the length of an embodiment of the present invention.
Figure 6B:
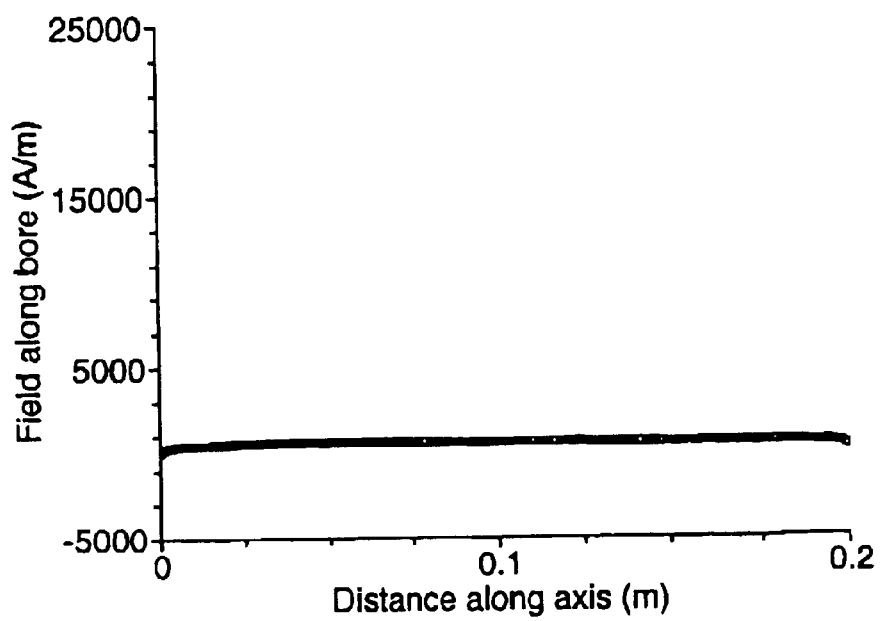
FIG. 6b is a graph showing a more uniform bias field profile in accordance with one embodiment of the present invention.

An alternative means of producing a bias field was achieved by incorporating 20% fraction of a magnetic material—$Nd_2Fe_{14}B$—into a polymer material, which was subsequently formed into a sheath to encompass the amorphous elongate. FIG. 6a shows the calculated variation in bias field strength along the length of the elongate material when covered by the magnetic sheath. Along the central portion of the elongate (0.05–0.15 on the x-axis of the graph). a uniform bias field has been generated. At the ends of the elongate, the bias filed is non-uniform. To overcome this non-uniformity of the bias field, the filling fraction of the magnetic material in the polymer sheath can be modified. FIG. 6b shows a more uniform bias field profile, achieved by reducing the fraction of permanent magnetic material at the ends of the polymer sheath.

EXAMPLE 5

By incorporating the features explained in examples 1, 2 and 3 i.e. a voltage frequency of 1 MHz, annealing the elongate and producing a uniform bias field, in an amorphous elongate of $(Co_{0.94}Fe_{0.06})_{72.5}Si_{12.5}B_{15}$, a 20 cm long magnetic sensor with a sensitivity of 10–20 nT with a field measurement range of ±500 µT was made.

What is claimed is:

1. A magnetic field sensor, said sensor comprising:
   an elongate sensor element component made of a substantially amorphous material which exhibits giant magneto-impedance (GMI); and
   bias means for biasing a field applied to said component to operate in the high field section of the GMI response.

2. A magnetic sensor in accordance with claim 1 in which said bias means comprises a solenoid winding.

3. A magnetic sensor in accordance with claim 1 in which said bias means comprises a permanent magnetic material.

4. A magnetic sensor in accordance with claim 1 wherein the substantially amorphous material is an alloy comprising substantially cobalt, silicon and boron.

5. A magnetic sensor in accordance with claim 4 wherein the substantially amorphous material also includes one or more of the elements iron, chromium and molybdenum.

6. A magnetic sensor in accordance with claim 1 wherein the substantially amorphous element has the composition $(Co_{0.94}Fe_{0.06})_{72.5}Si_{12.5}B_{15}$.

7. A magnetic sensor in accordance with claim 1 wherein the sensor element has been annealed.

8. A magnetic sensor in accordance claim 1 including a bridge circuit for measuring the impedance of the sensor element.

9. A magnetic sensor in accordance with claim 8 wherein the in-phase and quadrature components of the bridge circuit output are combined to improve the stability and linearity of the sensor response.

10. A magnetic sensor for measuring an external magnetic field strength comprising at least two elongate sensor elements as claimed in claim 5.

* * * * *